United States Patent
Yamaguchi et al.

(10) Patent No.: US 10,818,712 B2
(45) Date of Patent: Oct. 27, 2020

(54) SOLID-STATE IMAGE PICKUP DEVICE AND METHOD OF MANUFACTURE, AND ELECTRONIC DEVICE

(71) Applicant: SONY SEMICONDUCTOR SOLUTIONS CORPORATION, Kanagawa (JP)

(72) Inventors: Tetsuji Yamaguchi, Kanagawa (JP); Atsushi Toda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/319,382

(22) PCT Filed: Jul. 25, 2017

(86) PCT No.: PCT/JP2017/026766
§ 371 (c)(1),
(2) Date: Jan. 21, 2019

(87) PCT Pub. No.: WO2018/030138
PCT Pub. Date: Feb. 15, 2018

(65) Prior Publication Data
US 2019/0244993 A1  Aug. 8, 2019

(30) Foreign Application Priority Data

Aug. 8, 2016 (JP) .................. 2016-155292

(51) Int. Cl.
*H01L 27/146* (2006.01)
*H04N 5/369* (2011.01)
*G02B 5/28* (2006.01)

(52) U.S. Cl.
CPC .......... *H01L 27/14621* (2013.01); *G02B 5/28* (2013.01); *G02B 5/281* (2013.01);
(Continued)

(58) Field of Classification Search
CPC ......... H01L 27/14621; H01L 27/14649; H01L 27/14685; G02B 5/281
See application file for complete search history.

(56) References Cited

U.S. PATENT DOCUMENTS 5,726,805 A    3/1998  Kaushik et al.
2002/0080493 A1*  6/2002  Tsai ............... G02B 5/288
                                                  359/584
(Continued)

FOREIGN PATENT DOCUMENTS

CN    102983142 A    3/2013
JP    2008-053627 A  3/2008
(Continued)

OTHER PUBLICATIONS

International Search Report and Written Opinion of PCT Application No. PCT/JP2017/026766, dated Oct. 3, 2017, 10 pages of ISRWO.

*Primary Examiner* — Ermias T Woldegeorgis
(74) *Attorney, Agent, or Firm* — Chip Law Group

(57) ABSTRACT

Provided is a solid-state image pickup device and a method of manufacture, and an electronic device capable of suppressing occurrence of a transmission wavelength shift with a simpler design. The solid-state image pickup device includes a multilayer film filter having a laminated structure in which a transmission wavelength adjustment layer is sandwiched between a first multilayer film layer and a second multilayer film layer. The transmission wavelength adjustment layer is formed such that at least two types of dielectrics having different refractive indexes mixedly exist, and an effective refractive index is determined according to a ratio of the mixture. The effective refractive index of the transmission wavelength adjustment layer gradually increases from a chip central portion in which an incident
(Continued)

angle of light emitted onto the multilayer film filter is small toward a chip end portion in which the incident angle of light is large.

13 Claims, 14 Drawing Sheets

(52) U.S. Cl.
CPC ........ *H01L 27/146* (2013.01); *H01L 27/1462* (2013.01); *H01L 27/14605* (2013.01); *H01L 27/14634* (2013.01); *H01L 27/14649* (2013.01); *H01L 27/14685* (2013.01); *H04N 5/369* (2013.01)

(56) References Cited

U.S. PATENT DOCUMENTS

| 2013/0057738 A1 | 3/2013 | Konno et al. |
| 2013/0113964 A1 | 5/2013 | Sasaki et al. |

FOREIGN PATENT DOCUMENTS

| JP | 2013-055202 A | 3/2013 |
| JP | 2013-098503 A | 5/2013 |
| KR | 10-2013-0025823 A | 3/2013 |

\* cited by examiner

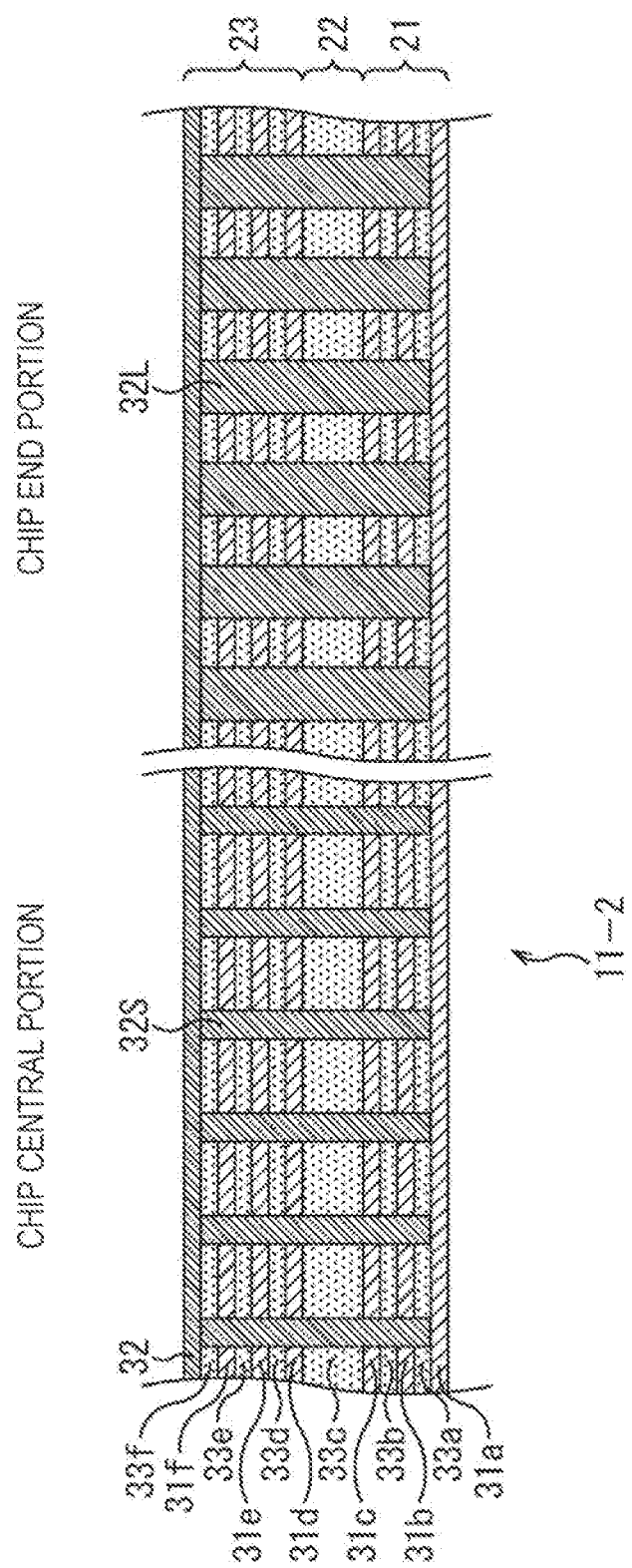

SOLID-STATE IMAGE PICKUP DEVICE AND METHOD OF MANUFACTURE, AND ELECTRONIC DEVICE

CROSS REFERENCE TO RELATED APPLICATIONS

This application is a U.S. National Phase of International Patent Application No. PCT/JP2017/026766 filed on Jul. 25, 2017, which claims priority benefit of Japanese Patent Application No. JP 2016-155292 filed in the Japan Patent Office on Aug. 8, 2016. Each of the above-referenced applications is hereby incorporated herein by reference in its entirety.

TECHNICAL FIELD

The present disclosure relates to a solid-state image pickup device and a method of manufacture, and an electronic device, and in particular, to a solid-state image pickup device and a method of manufacture, and an electronic device capable of suppressing occurrence of a transmission wavelength shift with a simpler design.

BACKGROUND ART

Conventionally, image pickup devices such as complementary metal oxide semiconductor (CMOS) image sensors and charge coupled device (CCD) image sensors are used for imaging devices. The image pickup device has a device structure in which a color filter that transmits light in the wavelength band of red, green, and blue is laminated on the light receiving surface, and light in each wavelength band is detected, thereby capturing an image.

Furthermore, in recent years, image sensors have been widely used. For example, it has been considered to capture an image by detecting light in the infrared wavelength band, and to capture an image by detecting light decomposed into multiple wavelengths (multi-spectrum) with wavelengths more than those of red, green, and blue. For such a use, in addition to spectroscopic processing using a conventional color filter, it has been considered to use a multilayer film filter capable of steeply transmitting only light having a target wavelength using the optical interference effect of a multilayer film having different dielectric constants.

The multilayer film filter controls the wavelength to be transmitted using the optical interference effect. Therefore, for example, in a region in which an incident angle of light in a chip of a CMOS image sensor is different, an optical path length at the time of transmitting through the multilayer film filter changes, whereby a transmission wavelength transmitting through each region shifts. As a result, in an electronic device having a large incident angle of light such as a small camera module typified by what is called a smartphone or the like, the transmission wavelength shift occurs notably at a chip central portion and a chip end portion according to the incident angle of light.

For example, Patent Document 1 discloses an invention in which a fine structure having a different interference characteristic is added under a multilayer film filter, and the microstructure of the structure is changed according to an incident angle of light in a chip, thereby suppressing a transmission wavelength peak shift.

CITATION LIST

Patent Document

Patent Document 1: Japanese Patent Application Laid-Open No. 2013-55202

SUMMARY OF THE INVENTION

Problems to be Solved by the Invention

However, the structure proposed in the invention of Patent Document 1 needs to be designed in consideration of the combined interference effect of the structure of the multilayer film filter and the microstructure, which makes the laminated structure of the structure of the multilayer film filter and the microstructure complicated.

The present disclosure has been conceived in view of such circumstances, and it is intended to suppress occurrence of a transmission wavelength shift with a simpler design.

Solutions to Problems

A solid-state image pickup device according to one aspect of the present disclosure including at least a first layer having a first refractive index, a second layer having a second refractive index, and a third layer having a third refractive index, which are laminated, the solid-state image pickup device includes a multilayer film filter having a laminated structure in which the third layer is sandwiched between the first layer and the second layer, in which the third layer is formed such that at least two types of dielectrics having different refractive indexes mixedly exist and an effective refractive index is determined according to a ratio of the mixture, and the ratio of the mixture of the two types of dielectrics is adjusted across a surface of the third layer such that the effective refractive index of the third layer gradually increases from a portion in which an incident angle of light emitted onto the multilayer film filter is small toward a portion in which the incident angle of light is large.

A method of manufacturing a solid-state image pickup device according to one aspect of the present disclosure including at least a first layer having a first refractive index, a second layer having a second refractive index, and a third layer having a third refractive index, which are laminated, the solid-state image pickup device including: a multilayer film filter having a laminated structure in which the third layer is sandwiched between the first layer and the second layer, in which the third layer is formed such that at least two types of dielectrics having different refractive indexes mixedly exist and an effective refractive index is determined according to a ratio of the mixture, and the ratio of the mixture of the two types of dielectrics is adjusted across a surface of the third layer such that the effective refractive index of the third layer gradually increases from a portion in which an incident angle of light emitted onto the multilayer film filter is small toward a portion in which the incident angle of light is large, the method includes steps of: embedding, in a first dielectric serving as a base material having a predetermined refractive index, a second dielectric having a refractive index different from the refractive index of the first dielectric; and forming, using the second dielectric, a structure having a size smaller than a transmission wavelength of light transmitted through the multilayer film filter.

An electronic device according to one aspect of the present disclosure includes a solid-state image pickup device including at least a first layer having a first refractive index, a second layer having a second refractive index, and a third layer having a third refractive index, which are laminated, the solid-state image pickup device including: a multilayer film filter having a laminated structure in which the third layer is sandwiched between the first layer and the second layer, in which the third layer is formed such that at least two types of dielectrics having different refractive indexes mixedly exist and an effective refractive index is determined according to a ratio of the mixture, and the ratio of the mixture of the two types of dielectrics is adjusted across a surface of the third layer such that the effective refractive index of the third layer gradually increases from a portion in which an incident angle of light emitted onto the multilayer film filter is small toward a portion in which the incident angle of light is large.

According to one aspect of the present disclosure, in a multilayer film filter including a first layer having a first refractive index, a second layer having a second refractive index, and a third layer having a third refractive index, which are laminated, the multilayer film filter having a laminated structure in which the third layer is sandwiched between the first layer and the second layer, the third layer is formed such that at least two types of dielectrics having different refractive indexes mixedly exist, and an effective refractive index is determined according to a ratio of the mixture. Then, the ratio of the mixture of the two types of dielectrics is adjusted across a surface of the third layer such that the effective refractive index of the third layer gradually increases from a portion in which an incident angle of light emitted onto the multilayer film filter is small toward a portion in which the incident angle of light is large.

Effects of the Invention

According to one aspect of the present disclosure, occurrence of a transmission wavelength shift can be suppressed with a simpler design.

BRIEF DESCRIPTION OF DRAWINGS

FIG. 7 is a cross-sectional view illustrating an exemplary configuration of a multilayer film filter according to a third embodiment.

MODE FOR CARRYING OUT THE INVENTION

Hereinafter, specific embodiments to which the present technology is applied will be described in detail with reference to the accompanying drawings.

First Exemplary Configuration of Multilayer Film Filter

Figure 1:
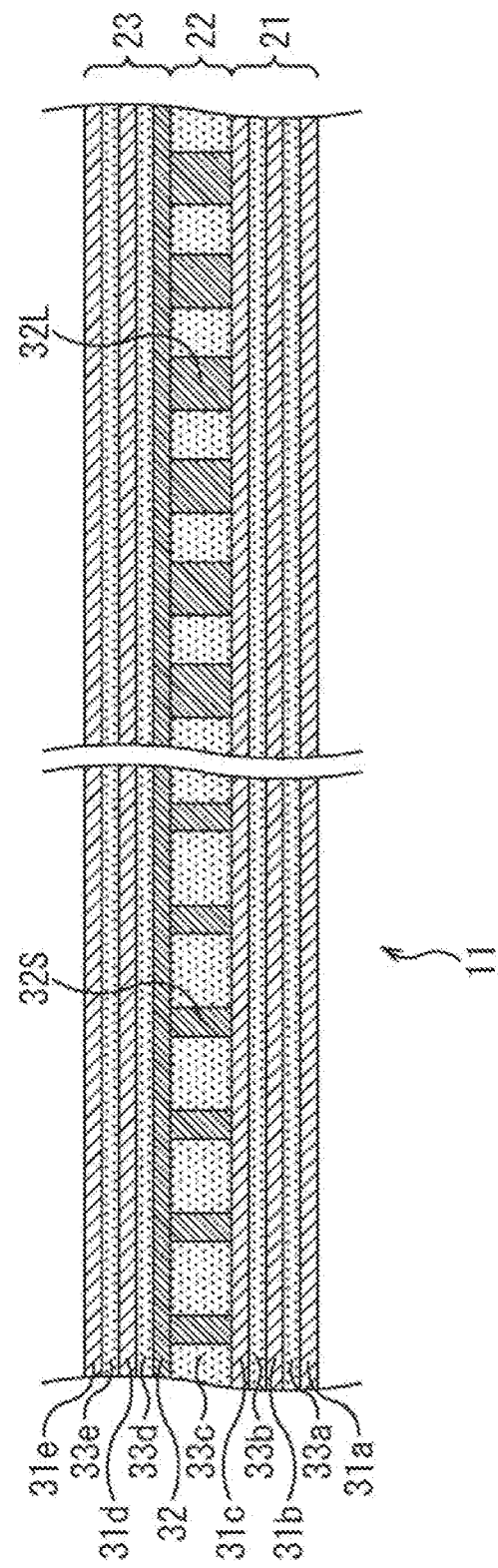
FIG. 1 is a cross-sectional view illustrating an exemplary configuration of a multilayer film filter included in an image pickup device to which the present technology is applied according to a first embodiment.

FIG. 1 is a cross-sectional view illustrating an exemplary configuration of a multilayer film filter included in an image pickup device to which the present technology is applied according to a first embodiment.

A multilayer film filter 11 illustrated in FIG. 1 is laminated on a semiconductor substrate (not illustrated) on which a photodiode is formed for each pixel, which is configured by laminating, in the order from the side of the semiconductor substrate, a first multilayer film layer 21, a transmission wavelength adjustment layer 22, and a second multilayer film layer 23. In other words, the multilayer film filter 11 has a laminated structure in which the transmission wavelength adjustment layer 22 is sandwiched between two layers of the first multilayer film layer 21 and the second multilayer film layer 23, and a transmission wavelength of the multilayer film filter 11 is determined on the basis of a film thickness and a refractive index of the transmission wavelength adjustment layer 22.

Furthermore, in the multilayer film filter 11, a high refractive index material 31, a high refractive index material 32, and a low refractive index material 33, which include dielectrics having different refractive indexes, are laminated, whereby the first multilayer film layer 21, the transmission wavelength adjustment layer 22, and the second multilayer film layer 23 are formed.

The first multilayer film layer 21 has a periodic structure in which a high refractive index material 31a, a low refractive index material 33a, a high refractive index material 31b, a low refractive index material 33b, and a high refractive index material 31c are laminated.

The transmission wavelength adjustment layer 22 is formed such that the high refractive index material 32 and the low refractive index material 33 are mixed, and the effective refractive index of the transmission wavelength adjustment layer 22 is determined depending on a mixture ratio thereof. In other words, the transmission wavelength adjustment layer 22 is formed such that a pattern of a structure including fine columnar high refractive index materials 32S and 32L having a scale smaller than the transmission wavelength is embedded in the low refractive index material 33c serving as a base material. Furthermore, the high refractive index materials 32S and 32L are formed to have different diameters, respectively, and the effective refractive index of the transmission wavelength adjustment layer 22 is determined according to each ratio (volume ratio)

of the high refractive index material 32S and the high refractive index material 32L mixedly existing in the low refractive index material 33c.

The second multilayer film layer 23 has a periodic structure in which the high refractive index material 32, a low refractive index material 33d, a high refractive index material 31d, a low refractive index material 33e, and a high refractive index material 31e are laminated.

Here, in the multilayer film filter 11, the refractive index of the transmission wavelength adjustment layer 22 is adjusted such that the transmission wavelengths coincide with each other between a central portion of an imaging surface of an image pickup device to which the multilayer film filter 11 is adopted (hereinafter referred to as chip central portion) and an end portion of the imaging surface (hereinafter referred to as chip end portion).

In general, optical interference depends on n×cos θ using a film refractive index n and an incident angle θ. Therefore, at the chip end portion where the incident angle θ is large, the film refractive index n is increased accordingly, whereby fluctuation of the transmission wavelength due to interference can be suppressed.

Accordingly, in the multilayer film filter 11, the transmission wavelength adjustment layer 22 is formed such that the refractive index becomes larger at the chip end portion than at the chip central portion, whereby occurrence of a transmission wavelength shift can be reduced.

For example, the transmission wavelength adjustment layer 22 is formed in such a manner that a pattern of fine holes is formed using the low refractive index material 33c as a base material, and the high refractive index materials 32L and 32S, which have a relatively large refractive index compared with that of the low refractive index material 33c, are embedded in the holes. At this time, as illustrated in FIG. 2, control is performed such that diameters of the holes formed in the low refractive index material 33c gradually increases from the chip central portion in which the incident angle of light is small toward the chip end portion in which the incident angle of light is large.

Figure 2:
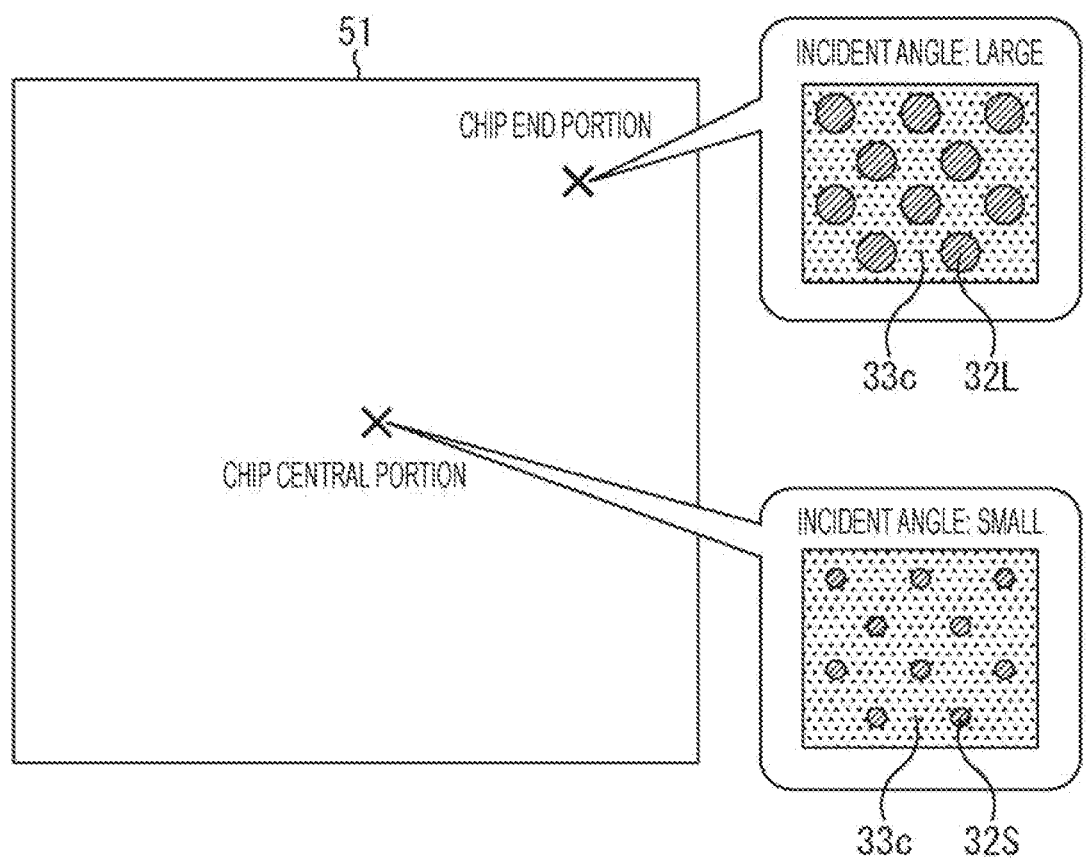
FIG. 2 is a plan view of an image pickup device employing a multilayer film filter.

FIG. 2 illustrates a plan view of an image pickup device 51 employing the multilayer film filter 11.

As illustrated in FIG. 2, the refractive index across the surface of the image pickup device 51 is adjusted such that the refractive index gradually increases from the chip central portion toward the chip end portion by decreasing the diameter of the high refractive index material 32S at the chip central portion and increasing the diameter of the high refractive index material 32L at the chip end portion. In other words, since the incident angle of light is small at the chip central portion of the image pickup device 51, the effective refractive index of the transmission wavelength adjustment layer 22 can be made relatively small by embedding the high refractive index material 32S having a small diameter in the low refractive index material 33c. On the other hand, since the incident angle of light is large at the chip end portion of the image pickup device 51, the effective refractive index of the transmission wavelength adjustment layer 22 can be made relatively large by embedding the high refractive index material 32L having a large diameter in the low refractive index material 33c.

In this manner, in the multilayer film filter 11, the optical film thickness of the transmission wavelength adjustment layer 22 is adjusted according to the incident angle of light with respect to the image pickup device 51, whereby the occurrence of the transmission wavelength shift in the region within the chip having different incident angles of light can be suppressed. Here, the optical film thickness is determined by the refractive index of the film and a physical film thickness. Therefore, by adjusting the effective refractive index of the transmission wavelength adjustment layer 22 according to the incident angle within the chip, in other words, by appropriately designing the diameters of the high refractive index materials 32S and 32L, the occurrence of the transmission wavelength shift caused by the difference in the incident angle of light between the chip central portion and the chip end portion can be reduced.

Furthermore, conventionally, it is necessary to use a relatively large camera module having a small incident angle of light to make an image sensor using the multilayer film filter less influenced by the transmission wavelength shift. In contrast, in the image pickup device 51 to which the multilayer film filter 11 is adopted, the occurrence of the transmission wavelength shift can be reduced, whereby it can be applied to a small camera module having a small incident angle of light, which is typified by what is called a smartphone, for example. Moreover, since the image pickup device 51 to which the multilayer film filter 11 is adopted can suppress occurrence of unevenness in image quality or the like due to the transmission wavelength shift, an image with a higher image quality can be captured.

<Method of Manufacturing Multilayer Film Filter>

A method of manufacturing the multilayer film filter 11 in FIG. 1 will be described with reference to FIG. 3.

Figure 3:
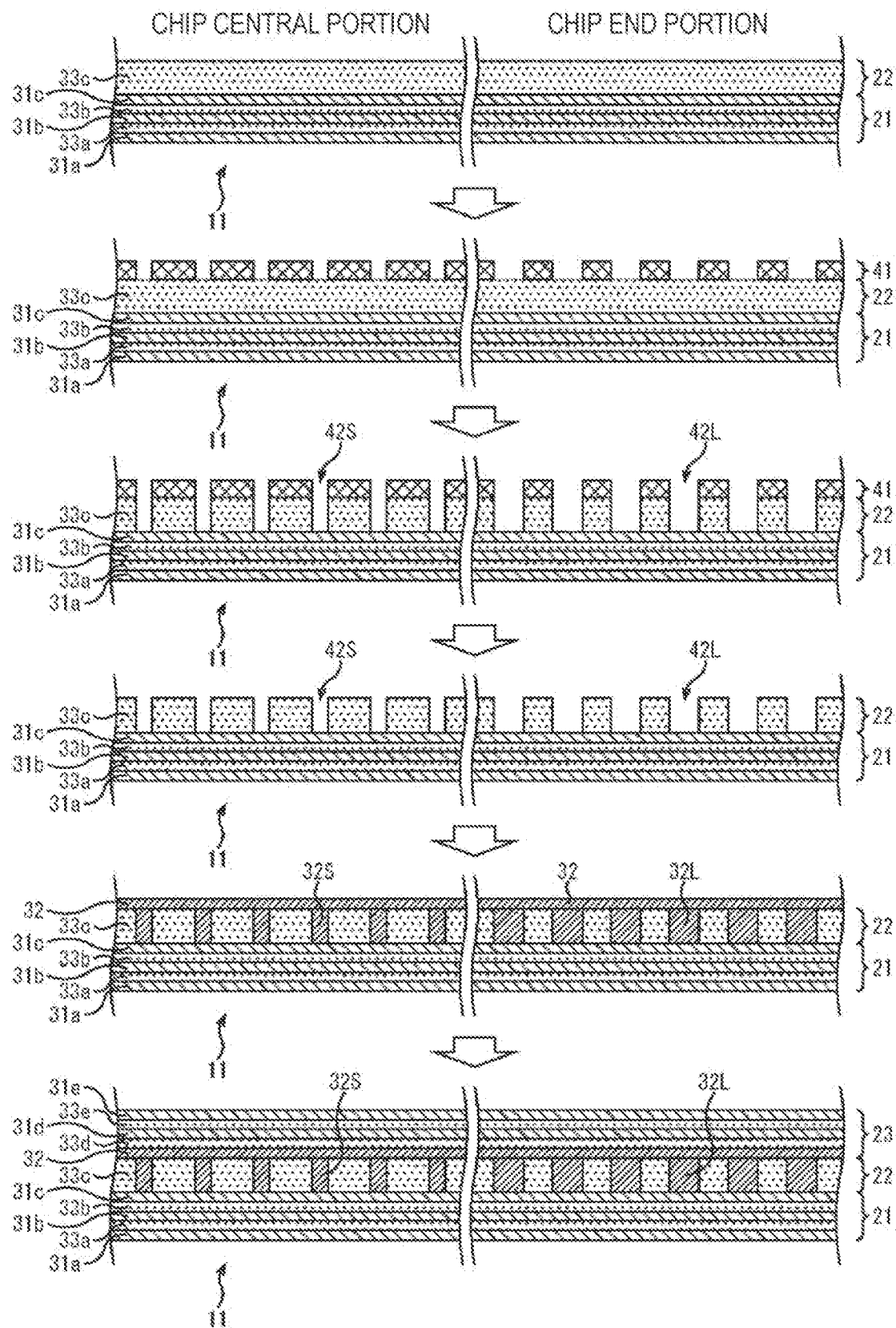
FIG. 3 is a diagram illustrating a method of manufacturing the multilayer film filter.

In a first step, as illustrated in the first stage in FIG. 3, a film of the low refractive index material 33c is formed on the entire surface of the first multilayer film layer 21 in which the high refractive index material 31a, the low refractive index material 33a, the high refractive index material 31b, the low refractive index material 33b, and the high refractive index material 31c are laminated.

In a second step, a film of a resist 41 is formed on the entire surface of the low refractive index material 33c, and then patterning is performed. Through this step, as illustrated in the second stage in FIG. 3, fine holes corresponding to the diameters of the high refractive index materials 32S and 32L embedded in the low refractive index material 33c are formed in the resist 41.

At this time, diameters of the fine holes formed on the resist 41 are designed to gradually increase as the distance from the chip central portion approaches to the chip end portion, whereby a difference can be provided between the refractive index at the chip central portion and the refractive index at the chip end portion without increasing the number of steps. Moreover, since the diameter of the hole is changed instead of changing a pitch of the hole, it is only necessary to perform calculation on chip size enlargement using a function corresponding to the distance from the chip central portion at the time of creating a mask pattern for processing, whereby it is easy to process in terms of the design.

In a third step, as illustrated in the third stage in FIG. 3, the low refractive index material 33c is etched using the resist 41, whereby a hole 42S for embedding the high refractive index material 32S therein and a hole 42L for embedding the high refractive index material 32L therein are formed.

In a fourth step, as illustrated in the fourth stage in FIG. 3, the resist 41 is removed.

In a fifth step, as illustrated in the fifth stage in FIG. 3, the high refractive index material 32S is embedded in the hole 42S and the high refractive index material 32L is embedded in the hole 42L, and at the same time, a film of the high refractive index material 32 is formed on the transmission wavelength adjustment layer 22.

In a sixth step, as illustrated in the sixth stage in FIG. 3, the low refractive index material 33d, the high refractive index material 31d, the low refractive index material 33e, and the high refractive index material 31e are laminated on the high refractive index material 32, thereby forming the second multilayer film layer 23.

Through the steps described above, the multilayer film filter 11 having a function of reducing the occurrence of the transmission wavelength shift can be produced.

Note that SiO2 may be used for the low refractive index material 33, and SiN, TiO2, Al2O3, Ta2O5, HfO2, or the like may be appropriately selected and used for the high refractive index material 31 and the high refractive index material 32. Furthermore, a shape of the hole for forming the high refractive index materials 32S and 32L is not limited to a circular shape, and a shape such as a quadrangular shape and a polygonal shape may be adopted.

<Variations of Transmission Wavelength Adjustment Layer>

Variations of the transmission wavelength adjustment layer 22 will be described with reference to FIGS. 4A, 4B, and 4C.

Figure 4A:
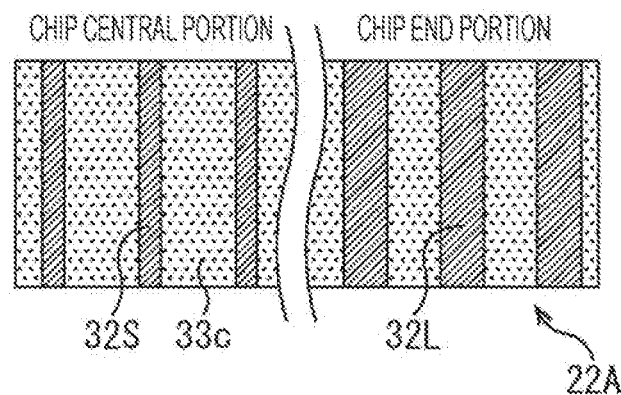
FIGS. 4A, 4B, and 4C are diagrams illustrating a variation of a transmission wavelength adjustment layer.

A first variation of the transmission wavelength adjustment layer 22 is illustrated in FIG. 4A.

As illustrated in of FIG. 4A, a transmission wavelength adjustment layer 22A is formed such that a pattern of a structure including the high refractive index materials 32S and 32L in a fine line shape having a width narrower than the transmission wavelength as viewed from above is embedded in the low refractive index material 33c. In this manner, the line-shaped pattern is used for the high refractive index materials 32S and 32L, whereby occupancy of the high refractive index materials 32S and 32L with respect to the low refractive index material 33c can be easily increased compared with the configuration using the columnar pattern as illustrated in FIG. 2. Accordingly, it becomes easy to enlarge the control range of the refractive index in the transmission wavelength adjustment layer 22A.

Furthermore, in the line-shaped high refractive index materials 32S and 32L, a pitch of the pattern is made constant, and only the width of the pattern is changed. Accordingly, at the time of creating the mask pattern for processing, it is only necessary to perform calculation on chip size enlargement using the function corresponding to the distance from the chip central portion, whereby it is also easy to process in terms of the design.

Figure 4B:
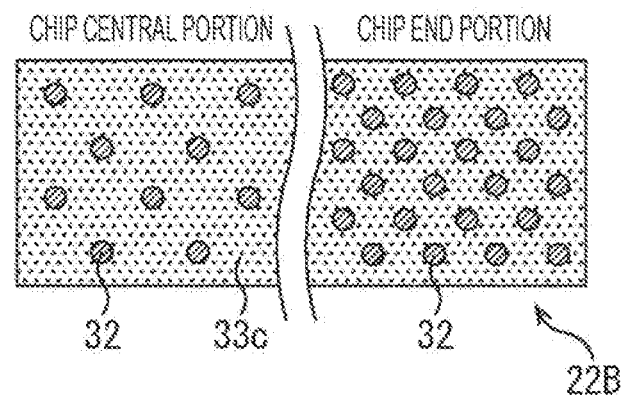

A second variation of the transmission wavelength adjustment layer 22 is illustrated in FIG. 4B.

As illustrated in FIG. 4B, a transmission wavelength adjustment layer 22B is formed such that arrangement density of the fine columnar pattern of the high refractive index material 32 embedded in the low refractive index material 33c as viewed from above differs between the chip central portion and the chip end portion.

In other words, the transmission wavelength adjustment layer 22B is formed such that the high refractive index material 32 at the chip central portion is disposed to have low pattern density, and the high refractive index material 32 at the chip end portion is disposed to have high pattern density. Accordingly, in the transmission wavelength adjustment layer 22B, the effective refractive index at the chip central portion is low, and the effective refractive index at the chip end portion is high. For example, in the transmission wavelength adjustment layer 22B, a mask is designed in such a manner that generation density of a pattern of the hole for forming the high refractive index material 32 changes according to the distance from the chip central portion.

Figure 4C:
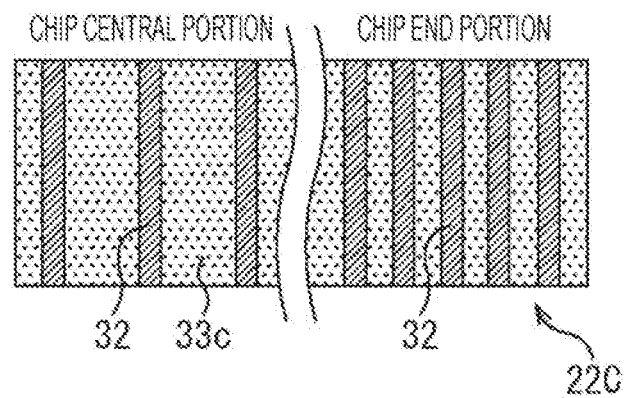

A third variation of the transmission wavelength adjustment layer 22 is illustrated in FIG. 4C.

As illustrated in FIG. 4C, a transmission wavelength adjustment layer 22C is formed such that arrangement density of the fine line-shaped pattern of the high refractive index material 32 embedded in the low refractive index material 33c as viewed from above differs between the chip central portion and the chip end portion.

In other words, the transmission wavelength adjustment layer 22C is formed such that the high refractive index material 32 at the chip central portion is disposed to have low pattern density, and the high refractive index material 32 at the chip end portion is disposed to have high pattern density. Accordingly, in the transmission wavelength adjustment layer 22C, the effective refractive index at the chip central portion is low, and the effective refractive index at the chip end portion is high. For example, in the transmission wavelength adjustment layer 22C, a mask is designed in such a manner that generation density of a pattern of the line for forming the high refractive index material 32 changes according to the distance from the chip central portion.

Note that, although the pattern of the structure of the high refractive index material 32 is embedded in the low refractive index material 33c serving as a base material to form the transmission wavelength adjustment layer 22 in the multilayer film filter 11, a configuration in which a pattern of a structure of a low refractive index material is embedded in a high refractive index material serving as a base material may be adopted, for example. In this case, the size and the arrangement density of the structure of the low refractive index material with respect to the base material of the high refractive index material is opposite to those of the transmission wavelength adjustment layer 22. In other words, in this case, at the chip central portion, the structure of the low refractive index material relative to the base material of the high refractive index material is enlarged, or the arrangement density of the structure of the low refractive index material is increased. Likewise, in this case, at the chip end portion, the structure of the low refractive index material relative to the base material of the high refractive index material is made smaller, or the arrangement density of the structure of the low refractive index material is decreased.

Furthermore, in the multilayer film filter 11, since the low refractive index material 33c serves as a base material of the transmission wavelength adjustment layer 22, the transmission wavelength adjustment layer 22 is formed to have a refractive index lower than those of the first multilayer film layer 21 and the second multilayer film layer 23. Meanwhile, for example, a configuration in which the transmission wavelength adjustment layer 22 has a refractive index higher than those of the first multilayer film layer 21 and the second multilayer film layer 23 may be adopted.

Moreover, in the multilayer film filter 11, the first multilayer film layer 21 and the second multilayer film layer 23 may be formed as a single layer and to have a desired refractive index. Furthermore, in the multilayer film filter 11, the refractive indexes of the first multilayer film layer 21 and the second multilayer film layer 23 may be set to be the same (same laminated structure), or those refractive indexes may be set to be different.

Second Exemplary Configuration of Multilayer Film Filter

A second embodiment of a multilayer film filter will be described with reference to FIGS. 5A 5B, 6A, 6B, and 6C.

For example, a multilayer film filter 11-1 can be used for a sensor (multispectral sensor) that detects multiple wavelengths in a chip.

Figure 5A:
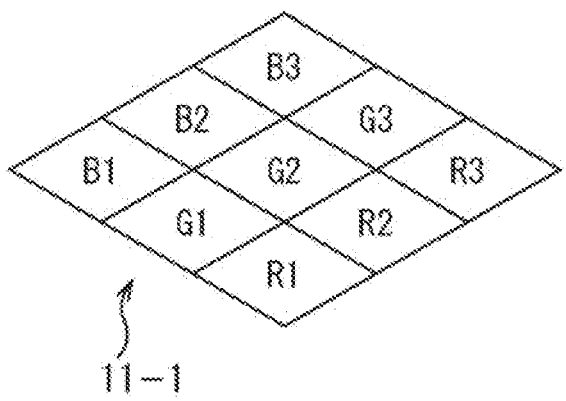
FIGS. 5A and 5B are diagrams illustrating application to a multispectral sensor.
Figure 5B:
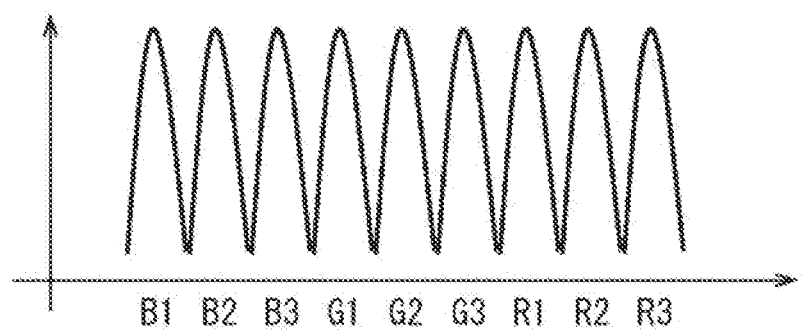

An overall perspective view of the multilayer film filter 11-1 is illustrated in FIG. 5A, and an exemplary transmission wavelength of the multilayer film filter 11-1 is illustrated in FIG. 5B.

In the example illustrated in FIGS. 5A and 5B, the transmission wavelength of the multilayer film filter 11-1 is set to be, in the ascending order of wavelengths, a first blue wavelength band B1, a second blue wavelength band B2, a third blue wavelength band B3, a first green wavelength band G1, a second green wavelength band G2, a third green wavelength band G3, a first red wavelength band R1, a second red wavelength band R2, and a third red wavelength band R3.

As illustrated in FIG. 5A, the multilayer film filter 11-1 is divided into nine regions so that light in the nine wavelength bands described above can be transmitted, and an effective refractive index of a transmission wavelength adjustment layer 22 is set such that the light in the different wavelength band is transmitted in each region. Then, in the multilayer film filter 11-1, the effective refractive index of the transmission wavelength adjustment layer 22 (i.e., ratio of a high refractive index material 32 to a low refractive index material 33c) is set for each wavelength band region according to the distance from a chip central portion, and an optical film thickness according to an incident angle of light is adjusted.

Figure 6A:
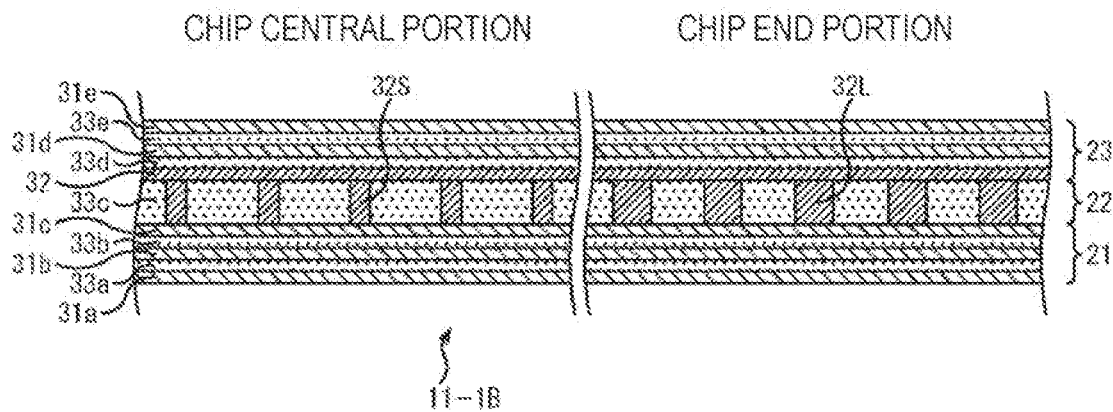
FIGS. 6A, 6B, and 6C are cross-sectional views illustrating an exemplary configuration of a multilayer film filter according to a second embodiment.
Figure 6B:
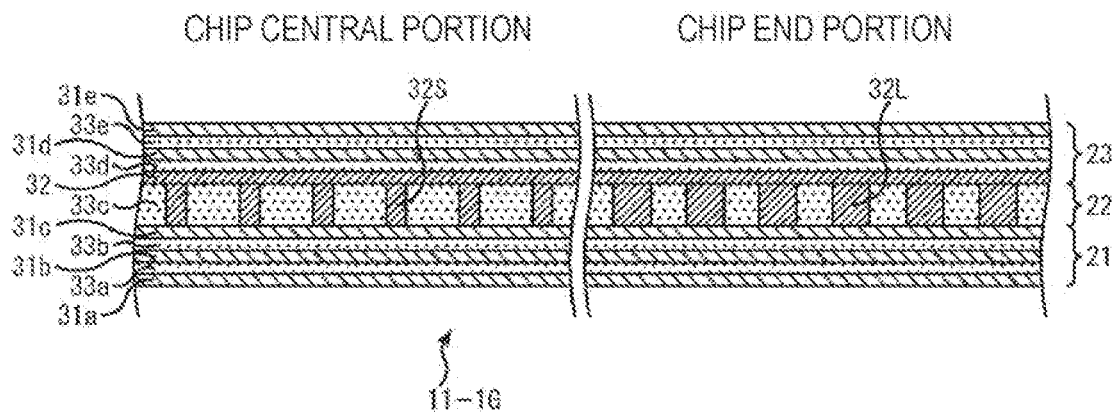
Figure 6C:
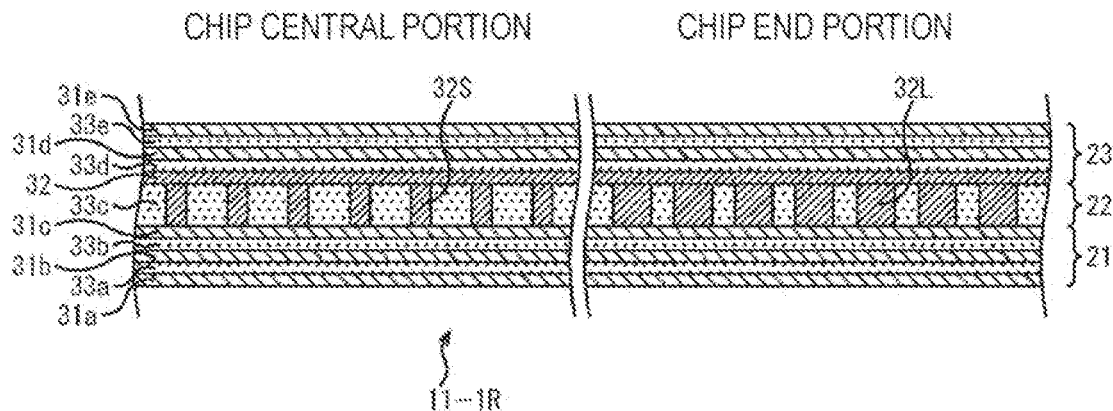

FIGS. 6A, 6B, and 6C are views illustrating a cross-sectional exemplary configuration of the multilayer film filter 11-1.

A blue wavelength band region 11-1B of the multilayer film filter 11-1 is illustrated in FIG. 6A, a green wavelength band region 11-1G of the multilayer film filter 11-1 is illustrated in FIG. 6B, and a red wavelength band region 11-1R of the multilayer film filter 11-1 is illustrated in FIG. 6C.

For example, in the multilayer film filter 11-1, first, a ratio of the high refractive index material 32 to be embedded in the low refractive index material 33c in the transmission wavelength adjustment layer 22 is set for each of the blue wavelength band region 11-1B, the green wavelength band region 11-1G, and the red wavelength band region 11-1R. In other words, the ratio of the high refractive index material 32 to the low refractive index material 33c is selected such that the region 11-1B transmits the blue wavelength band, and the ratio of the high refractive index material 32 to the low refractive index material 33c is selected such that the region 11-1G transmits the green wavelength band. Likewise, the ratio of the high refractive index material 32 to the low refractive index material 33c is selected such that the region 11-1R transmits the red wavelength band.

Moreover, in each of the blue wavelength band region 11-1B, the green wavelength band region 11-1G, and the red wavelength band region 11-1R, the diameters of the high refractive index materials 32S and 32L are adjusted according to the incident angle of light. For example, at the time of forming the transmission wavelength adjustment layer 22 of the multilayer film filter 11-1, it is possible to select, in one working mask, multiple wavelengths to be transmitted and to adjust the incident angle dependence in the chip simultaneously, whereby a multispectral sensor can be achieved through a simple process.

Third Exemplary Configuration of Multilayer Film Filter

FIG. 7 is a cross-sectional view illustrating an exemplary configuration of a multilayer film filter according to a third embodiment.

As illustrated in FIG. 7, in a multilayer film filter 11-2, high refractive index materials 32S and 32L are not formed to penetrate only a transmission wavelength adjustment layer 22 that determines a transmission wavelength of the multilayer film filter 11-2, but are formed to penetrate a first multilayer film layer 21, the transmission wavelength adjustment layer 22, and a second multilayer film layer 23. In other words, the multilayer film filter 11-2 has a structure in which a refractive index is adjusted through the first multilayer film layer 21, the transmission wavelength adjustment layer 22, and the second multilayer film layer 23 as a whole.

In the multilayer film filter 11-2 having such a configuration, in a similar manner to the multilayer film filter 11 in FIG. 1, the diameters of the high refractive index materials 32S and 32L are adjusted according to an incident angle of light with respect to an image pickup device 51. As a result, in the multilayer film filter 11-2, the refractive index is adjusted though the first multilayer film layer 21, the transmission wavelength adjustment layer 22, and the second multilayer film layer 23 as a whole, and occurrence of a transmission wavelength shift in a region within a chip having different incident angles of light can be suppressed.

<Method of Manufacturing Multilayer Film Filter>

A method of manufacturing the multilayer film filter 11-2 in FIG. 7 will be described with reference to FIG. 8.

Figure 8:
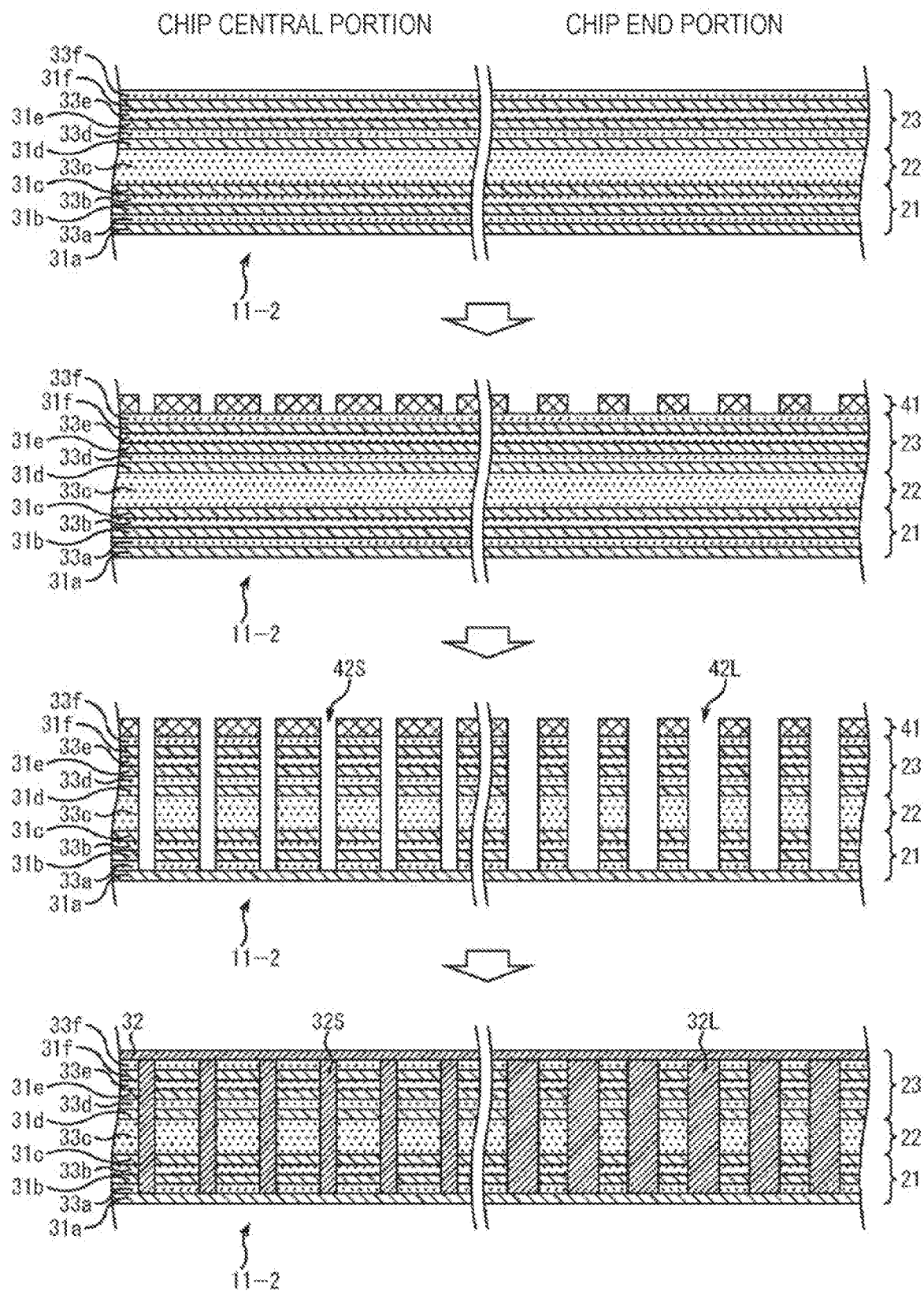
FIG. 8 is another diagram illustrating the method of manufacturing the multilayer film filter.

In a first step, as illustrated in the first stage in FIG. 8, a periodic structure in which a high refractive index material 31 and a low refractive index material 33 are laminated is formed such that the first multilayer film layer 21, the transmission wavelength adjustment layer 22, and the second multilayer film layer 23 are formed.

In a second step, a film of a resist 41 is formed on the entire surface of the second multilayer film layer 23, and then patterning is performed. Through this step, as illustrated in the second stage in FIG. 8, fine holes corresponding to the diameters of the high refractive index materials 32S and 32L are formed in the resist 41.

In a third step, as illustrated in the third stage in FIG. 8, the first multilayer film layer 21, the transmission wavelength adjustment layer 22, and the second multilayer film layer 23 are etched using the resist 41, whereby a hole 42S for embedding the high refractive index material 32S therein and a hole 42L for embedding the high refractive index material 32L therein are formed.

At this time, a high refractive index material 31a of the first multilayer film layer 21 is used as an etching stopper for stopping the etching. For example, the etching may be stopped on the high refractive index material 31a by using the difference in etching rate between the high refractive index material 31a and a low refractive index material 33a in the first multilayer film layer 21.

In a fourth step, as illustrated in the fourth stage in FIG. 3, after the resist 41 is removed, the high refractive index material 32S is embedded in the hole 42S and the high refractive index material 32L is embedded in the hole 42L, and at the same time, a film of the high refractive index material 32 is formed on a low refractive index material 33f.

Through the steps described above, it is possible to produce a multilayer film filter 11 having a function of reducing the occurrence of the transmission wavelength shift using the first multilayer film layer 21, the transmission wavelength adjustment layer 22, and the second multilayer film layer 23 as a whole.

Note that a shape of the hole for forming the high refractive index materials 32S and 32L is not limited to a circular shape, and a shape such as a quadrangular shape, a polygonal shape, a line shape, and the like may be adopted.

Exemplary Configuration of Image Pickup Device

An exemplary configuration of the image pickup device 51 including the multilayer film filter 11 will be described with reference to FIGS. 9 and 10.

Figure 9:
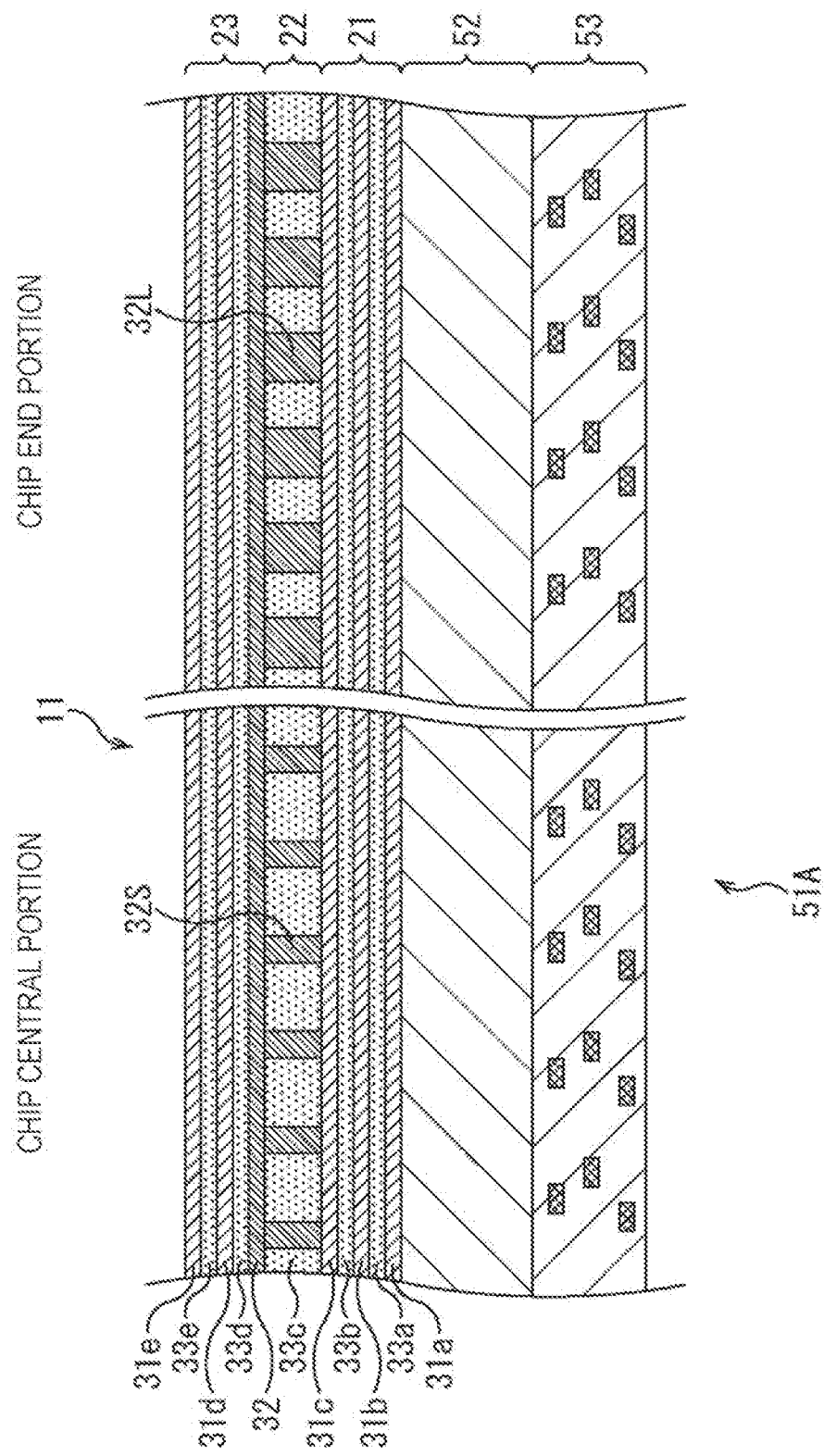
FIG. 9 is a cross-sectional view illustrating a first exemplary configuration of the image pickup device.

FIG. 9 is a cross-sectional view illustrating a first exemplary configuration of the image pickup device 51.

As illustrated in FIG. 9, an image pickup device 51A has a back surface irradiation structure in which a readout circuit 53 is disposed on the front surface (lower surface in FIG. 9) of a photoelectric conversion layer 52 including a substrate such as silicon, and the multilayer film filter 11 is disposed on the back surface side of the photoelectric conversion layer 52, for example. In other words, the image pickup device 51A has a structure in which the multilayer film filter 11, the photoelectric conversion layer 52, and the readout circuit 53 are laminated in that order from the light incident surface side. Furthermore, a photodiode is formed in the photoelectric conversion layer 52 for each pixel, and a multilayer wiring for reading a pixel signal generated by photoelectric conversion in the photoelectric conversion layer 52 is formed in the readout circuit 53.

In this manner, the image pickup device 51A is capable of more favorably suppressing the occurrence of the transmission wavelength shift in the region within the chip having different incident angles of light.

For example, in an image pickup device having a front surface irradiation structure, the multilayer film filter 11 is formed on the upper layer of the readout circuit 53 on which the multilayer wiring is formed, whereby there has been a possibility that variation in film thickness within a chip of an interlayer insulating film occurs at times due to the formation of the multilayer wiring. Accordingly, the interference effect in the multilayer film filter 11 varies, whereby it is assumed to be difficult to correct the transmission wavelength shift dependent on the incident angle of light.

Meanwhile, such variation does not occur in the image pickup device 51A since it has a configuration in which the multilayer film filter 11 is formed on the upper layer of the photoelectric conversion layer 52, and the transmission wavelength shift dependent on the incident angle of light can be reliably corrected.

Figure 10:
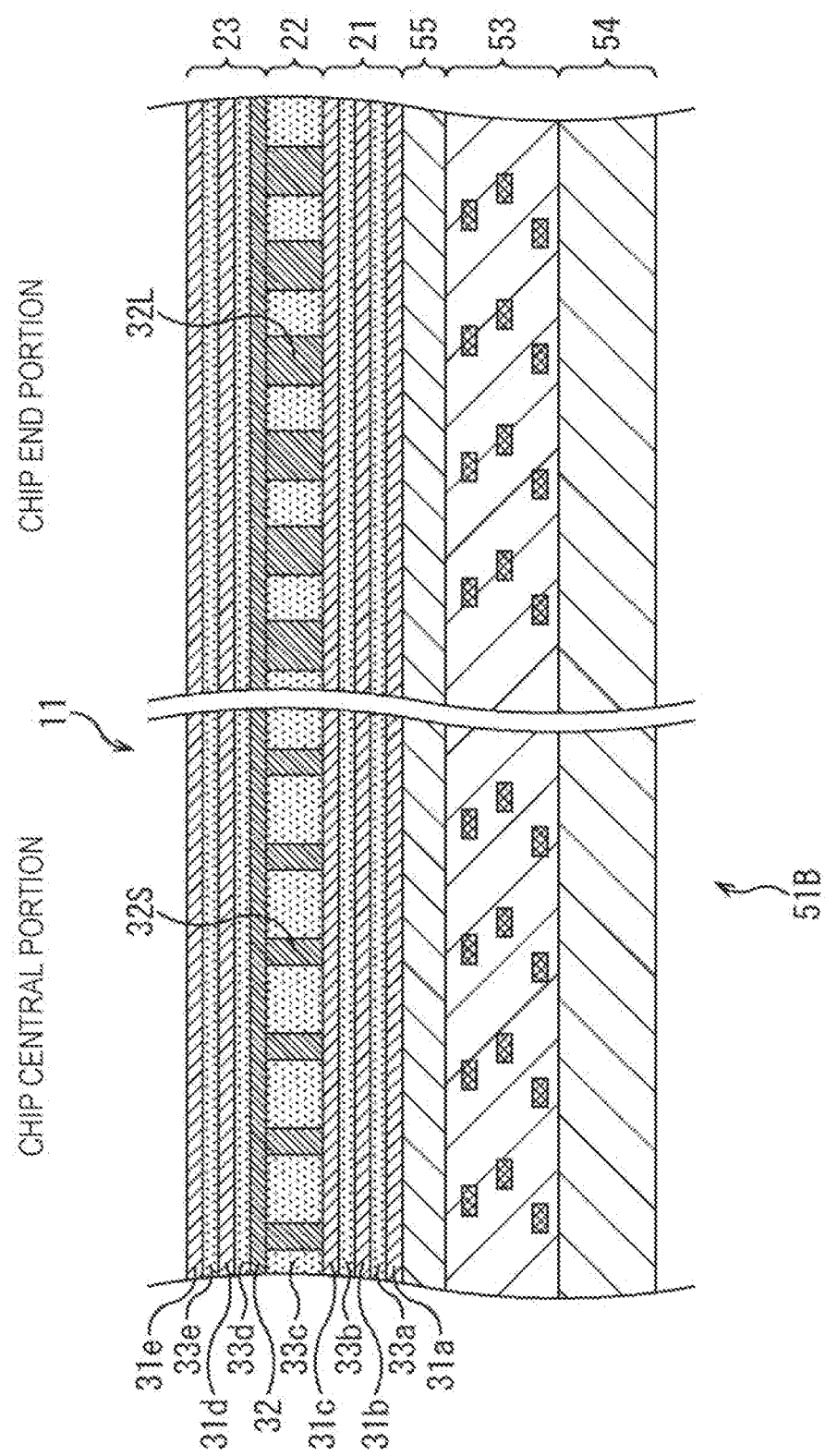
FIG. 10 is a cross-sectional view illustrating a second exemplary configuration of the image pickup device.

FIG. 10 is a cross-sectional view illustrating a second exemplary configuration of the image pickup device 51.

As illustrated in FIG. 10, an image pickup device 51B has, for example, a laminated type back surface irradiation structure in which a readout circuit 53 and a semiconductor circuit 54 are disposed on the front surface (lower surface in FIG. 10) of a photoelectric conversion film 55 formed by laminating a film of organic or inorganic material, and the multilayer film filter 11 is disposed on the back surface side of the photoelectric conversion film 55. In other words, the image pickup device 51B has a structure in which the multilayer film filter 11, the photoelectric conversion film 55, the readout circuit 53, and the semiconductor circuit 54 are laminated in that order from the light incident surface side. Furthermore, a photoelectric conversion portion is formed in the photoelectric conversion film 55 for each pixel.

In this manner, the image pickup device 51B has a configuration in which the multilayer film filter 11 is formed on the upper layer of the photoelectric conversion film 55, and in a similar manner to the image pickup device 51A in FIG. 9, the occurrence of the transmission wavelength shift in the region within the chip having different incident angles of light can be suppressed more favorably.

Note that the image pickup device 51 as described above can be applied to various electronic devices such as an imaging system such as a digital still camera and a digital video camera, a mobile phone having an imaging function, and other devices having the imaging function, for example.

Exemplary Configuration of Imaging Device

Figure 11:
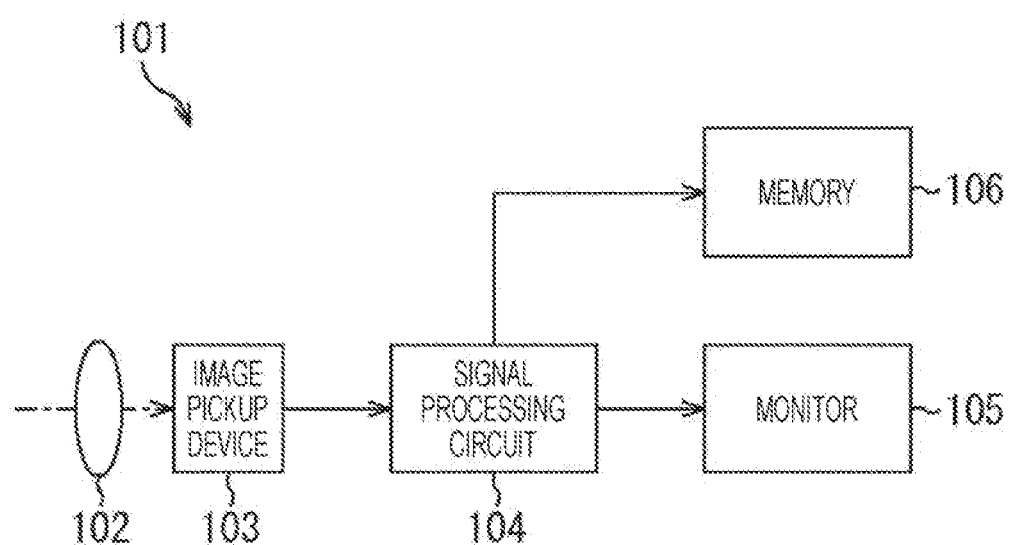
FIG. 11 is a block diagram illustrating an exemplary configuration of the imaging device mounted on an electronic device.

FIG. 11 is a block diagram illustrating an exemplary configuration of an imaging device mounted on an electronic device.

As illustrated in FIG. 11, an imaging device 101 includes an optical system 102, an image pickup device 103, a signal processing circuit 104, a monitor 105, and a memory 106, and is capable of capturing a still image and a moving image.

The optical system 102 includes one or a plurality of lenses, guides image light (incident light) from an object to the image pickup device 103, and forms an image on a light receiving surface (sensor unit) of the image pickup device 103.

As the image pickup device 103, the image pickup device 51 described above is applied. In the image pickup device 103, electrons are accumulated for a certain period of time according to an image formed on the light receiving surface via the optical system 102. Then, a signal corresponding to the electrons accumulated in the image pickup device 103 is supplied to the signal processing circuit 104.

The signal processing circuit 104 performs various signal processing on the pixel signal output from the image pickup device 103. An image (image data) obtained by applying the signal processing performed by the signal processing circuit 104 is supplied to the monitor 105 and displayed, or supplied to the memory 106 and stored (recorded).

In the imaging device 101 having such a configuration, by applying the image pickup device 51 described above, for example, the occurrence of the transmission wavelength shift is suppressed, whereby a high quality image without unevenness in image quality can be captured.

Usage Example of Image Sensor

Figure 12:
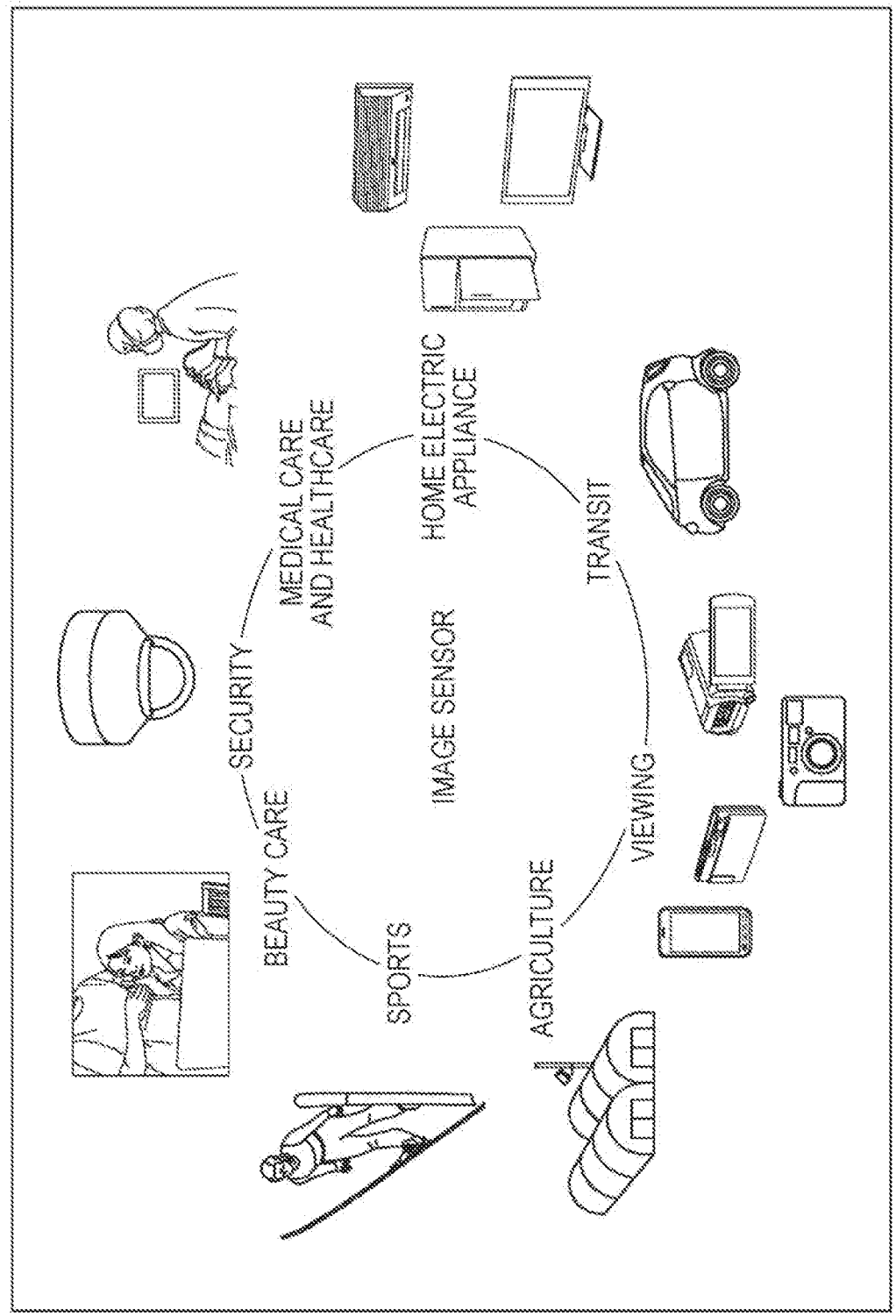
FIG. 12 is a diagram illustrating a usage example of an image sensor.

FIG. 12 is a diagram illustrating a usage example of the image sensor described above (image pickup device 51).

The image sensor described above can be used in, for example, various cases for sensing light such as visible light, infrared light, ultraviolet light, and an X-ray, as exemplified below.

- a device for capturing an image to be used for viewing such as a digital camera and a mobile device with a camera function
- a device for the use of transit such as an on-vehicle sensor for capturing a front side, a rear side, surroundings, inside, and the like of a vehicle for the purpose of safe driving such as an automatic stop, recognition of a driver's condition, and the like, a monitoring camera for monitoring a traveling vehicle and a road, and a ranging sensor for measuring a distance between vehicles and the like
- a device for the use of home electric appliances, such as a TV, a refrigerator, and an air conditioner, for capturing a gesture of a user and performing device operation in accordance with the gesture
- a device for a healthcare and medical use such as an endoscope and a device for performing angiography based on infrared light reception a device for the use of security such as an anti-crime monitoring camera and a camera for authenticating a person a device for the use of beauty purpose such as a skin measuring device for photographing a skin and a microscope for photographing a scalp a device for the use of sports such as an action camera and a wearable camera for a sports use and the like a device for the use of agriculture such as a camera for monitoring a condition of fields and crops Application Example to Mobile Body The technology according to the present disclosure (present technology) can be applied to various products. For example, the technology according to the present disclosure may be implemented as a device to be mounted on any type of mobile body such as a vehicle, electric vehicle, hybrid electric vehicle, motorcycle, bicycle, personal mobility, airplane, drone, ship, and robot.

Figure 13:
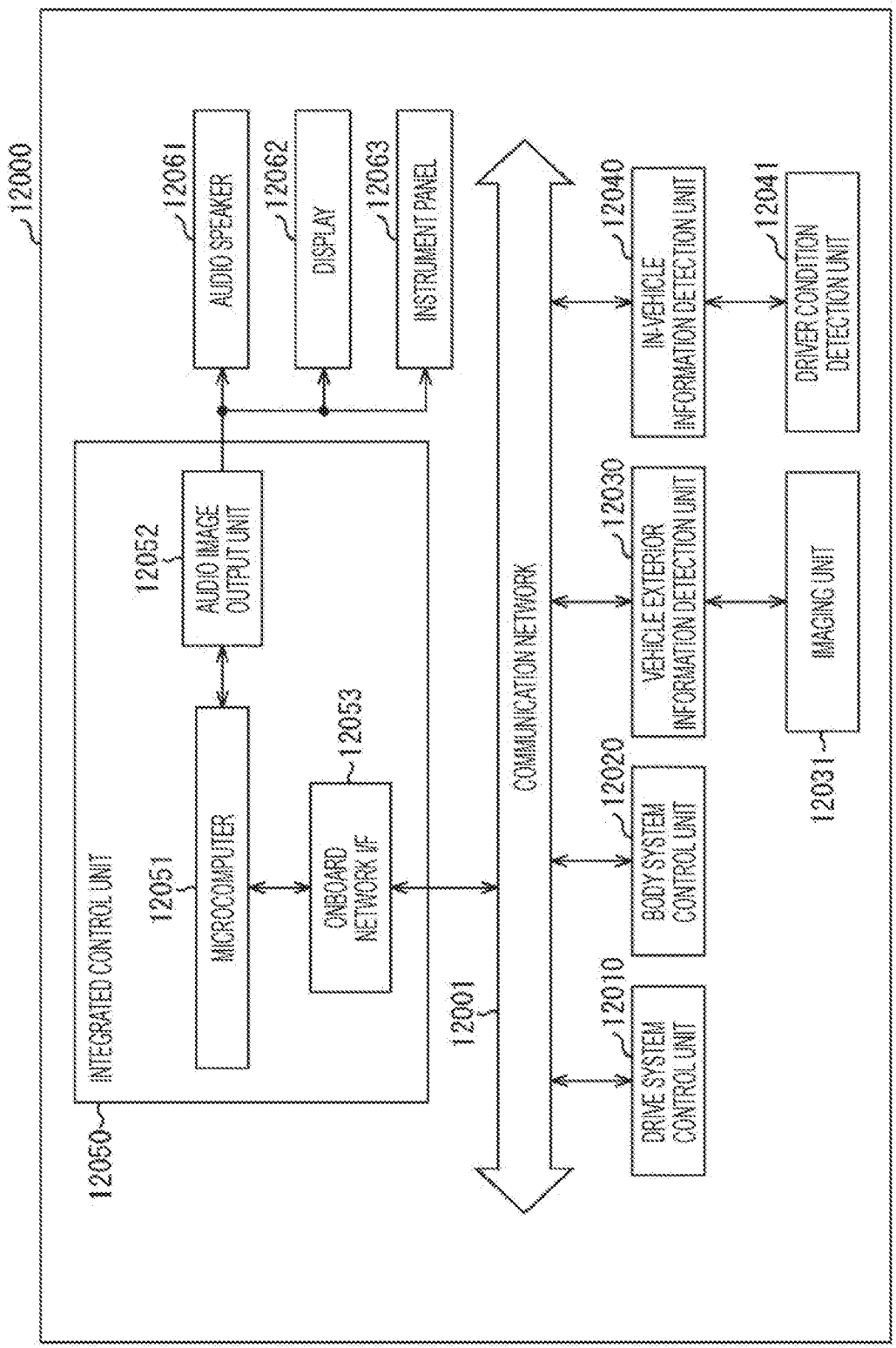
FIG. 13 is a block diagram illustrating a schematic exemplary configuration of a vehicle control system as an example of a mobile body control system to which the technology according to the present disclosure can be applied.

FIG. 13 is a block diagram illustrating a schematic exemplary configuration of a vehicle control system as an example of a mobile body control system to which the technology according to the present disclosure can be applied.

A vehicle control system 12000 includes a plurality of electronic control units connected via a communication network 12001. In the example illustrated in FIG. 13, the vehicle control system 12000 includes a drive system control unit 12010, a body system control unit 12020, a vehicle exterior information detection unit 12030, an in-vehicle information detection unit 12040, and an integrated control unit 12050. Furthermore, as a functional configuration of the integrated control unit 12050, a microcomputer 12051, an audio image output unit 12052, and an onboard network interface (I/F) 12053 are illustrated in the drawing.

The drive system control unit 12010 controls operation of a device related to a drive system of a vehicle according to various programs. For example, the drive system control unit 12010 functions as a control device of a driving force generation device for generating driving force of a vehicle such as an internal-combustion engine and a driving motor, a driving force transmission mechanism for transmitting driving force to wheels, a steering mechanism for adjusting a steering angle of a vehicle, a braking device for generating braking force of a vehicle, and the like.

The body system control unit 12020 controls operation of various devices installed on a vehicle body according to various programs. For example, the body system control unit 12020 functions as a control device of a keyless entry system, a smart key system, a power window device, or various lamps such as a head lamp, a back lamp, a brake lamp, a turn indicator, and a fog lamp. In this case, in the body system control unit 12020, radio waves transmitted from a portable device substituted for a key or signals of various switches may be input. The body system control unit 12020 receives input of those radio waves or the signals, and controls a door lock device, a power window device, a lamp, and the like.

The vehicle exterior information detection unit 12030 detects information regarding the outside of the vehicle on which the vehicle control system 12000 is installed. For example, an imaging unit 12031 is connected to the vehicle exterior information detection unit 12030. The vehicle exterior information detection unit 12030 causes the imaging unit 12031 to capture an image of the outside of the vehicle, and receives the captured image. The vehicle exterior information detection unit 12030 may perform, on the basis of the received image, detection processing of an object such as a person, a vehicle, an obstacle, a sign, and a character on a road, or distance detection processing.

The imaging unit 12031 is an optical sensor that receives light and outputs an electric signal corresponding to the amount of the light received. The imaging unit 12031 can output the electric signal as an image, or as information regarding the distance measurement. Furthermore, the light received by the imaging unit 12031 may be visible light, or may be invisible light such as infrared rays.

The in-vehicle information detection unit 12040 detects information regarding the inside of the vehicle. For example, a driver condition detection unit 12041 for detecting condition of a driver is connected to the in-vehicle information detection unit 12040. The driver condition detection unit 12041 includes, for example, a camera for imaging the driver, and the in-vehicle information detection unit 12040 may calculate a fatigue degree or a concentration degree of the driver or may determine whether the driver is dozing off on the basis of the detected information input from the driver condition detection unit 12041.

The microcomputer 12051 calculates a control target value of the driving force generation device, the steering mechanism, or the braking device on the basis of the information regarding the outside/inside of the vehicle obtained by the vehicle exterior information detection unit 12030 or the in-vehicle information detection unit 12040, and can output a control command to the drive system control unit 12010. For example, the microcomputer 12051 can perform cooperative control aiming at implementation of a function of the advanced driver assistance system (ADAS) including collision avoidance or impact mitigation of the vehicle, following travel based on the distance between vehicles, vehicle speed maintenance travelling, vehicle collision warning, vehicle lane departure warning, or the like.

Furthermore, the microcomputer 12051 controls the driving force generation device, the steering mechanism, the braking device, or the like on the basis of the information of the surroundings of the vehicle obtained by the vehicle exterior information detection unit 12030 or the in-vehicle information detection unit 12040, whereby the cooperative control aiming at autonomous driving for autonomously travelling without being dependent on the operation of the driver and the like can be performed.

Furthermore, the microcomputer 12051 can output a control command to the body system control unit 12020 on the basis of the information regarding the outside of the vehicle obtained by the vehicle exterior information detection unit 12030. For example, the microcomputer 12051 can perform the cooperative control aiming at anti-glaring such as switching of the high beam to the low beam by controlling the head lamp according to the position of a leading vehicle or an oncoming vehicle detected by the vehicle exterior information detection unit 12030.

The audio image output unit 12052 transmits at least one of output signals of audio or an image to an output device capable of visually or audibly notifying an occupant of the vehicle or the outside of the vehicle of information. In the example of FIG. 13, an audio speaker 12061, a display 12062, and an instrument panel 12063 are exemplified as the output device. The display 12062 may include, for example, at least one of an onboard display or a head-up display.

Figure 14:
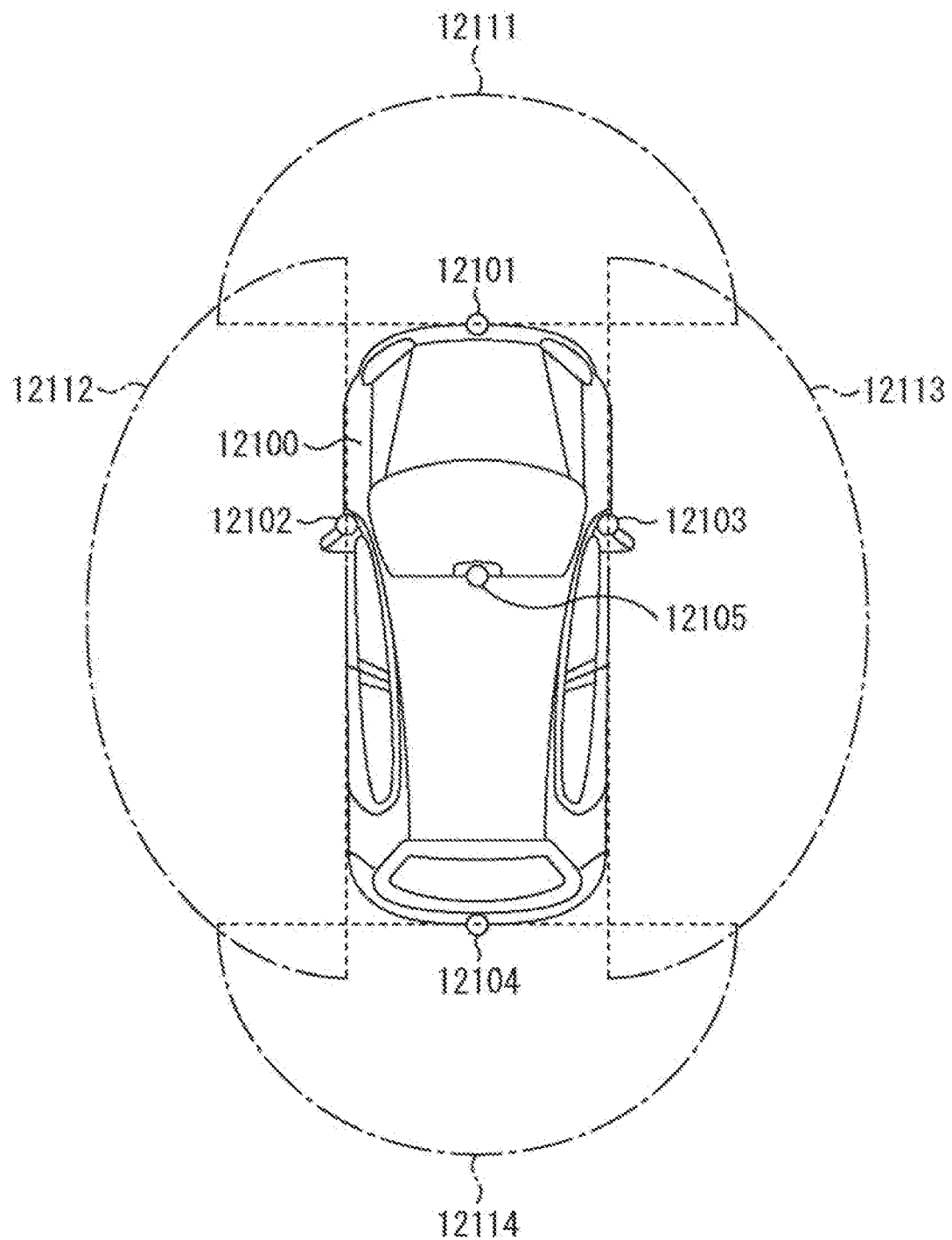
FIG. 14 is a diagram illustrating an example of an installation position of an imaging unit.

FIG. 14 is a diagram illustrating an example of an installation position of the imaging unit 12031.

In FIG. 14, as the imaging unit 12031, imaging units 12101, 12102, 12103, 12104, and 12105 are included.

For example, the imaging units 12101, 12102, 12103, 12104, and 12105 are provided at a position such as a front nose of the vehicle 12100, a side mirror, a rear bumper, a back door, and the upper portion of a vehicle interior windshield. The imaging unit 12101 provided on the front nose and the imaging unit 12105 provided on the upper portion of the vehicle interior windshield mainly obtain an image in front of the vehicle 12100. The imaging units 12102 and 12103 provided on the side mirrors mainly obtains an image of the lateral sides of the vehicle 12100. The imaging unit 12104 provided on the rear bumper or the back door mainly obtains an image behind the vehicle 12100. The imaging unit 12105 provided on the upper portion of the vehicle interior windshield is mainly used for detecting a leading vehicle, a pedestrian, an obstacle, a traffic signal, a traffic sign, a lane, or the like.

Note that an exemplary imaging range of the imaging units 12101 to 12104 is illustrated in FIG. 14. An imaging range 12111 indicates an imaging range of the imaging unit 12101 provided on the front nose, imaging ranges 12112 and 12113 indicate imaging ranges of the imaging units 12102 and 12103 provided on the side mirrors, respectively, and an imaging range 12114 indicates an imaging range of the imaging unit 12104 provided on the rear bumper or the back door. For example, image data captured by the imaging units 12101 to 12104 are superimposed, whereby an overhead image of the vehicle 12100 viewed from above can be obtained.

At least one of the imaging units 12101 to 12104 may have a function of obtaining distance information. For example, at least one of the imaging units 12101 to 12104 may be a stereo camera including a plurality of image pickup devices, or may be an image pickup device having pixels for detecting phase difference.

For example, the microcomputer 12051 calculates, on the basis of the distance information obtained from the imaging units 12101 to 12104, a distance to each three-dimensional object within the imaging ranges 12111 to 12114 and a temporal change of the distance (relative speed with respect to the vehicle 12100), whereby particularly a three-dimensional object traveling at a predetermined speed (e.g., 0 km/h or more) in substantially the same direction of the vehicle 12100, which is the closest three-dimensional object on the traveling path of the vehicle 12100, can be extracted as a leading vehicle. Moreover, the microcomputer 12051 can perform automatic brake control (including following travel stop control), automatic acceleration control (including following travel start control), and the like by setting the distance between vehicles to be secured in advance of a leading vehicle. In this manner, the cooperative control aiming at the autonomous driving for autonomously travelling without being dependent on the operation of the driver and the like can be performed.

For example, the microcomputer 12051 can extract, on the basis of the distance information obtained from the imaging units 12101 to 12104, three-dimensional object data relating to a three-dimensional object after dividing it into a motorcycle, an ordinary car, a large vehicle, a pedestrian, and other three-dimensional objects such as a utility pole, which can be used for automatic avoidance of obstacles. For example, the microcomputer 12051 distinguishes obstacles around the vehicle 12100 as an obstacle that can be visually recognized by the driver of the vehicle 12100 and an obstacle less likely to be visually recognized. Then, the microcomputer 12051 determines a collision risk indicating a degree of risk of collision with each obstacle, and in a case where the collision risk is equal to or more than a set value and there is a possibility of collision, a warning is output to the driver via the audio speaker 12061 or the display 12062, or forced deceleration or avoidance steering is performed via the drive system control unit 12010, whereby driving support for avoiding collision can be performed.

At least one of the imaging units 12101 to 12104 may be an infrared camera for detecting infrared rays. For example, the microcomputer 12051 can recognize a pedestrian by determining whether or not the pedestrian exists in the image captured by the imaging units 12101 to 12104. Such recognition of the pedestrian is performed by, for example, a procedure of extracting characteristic points in the image captured by the imaging units 12101 to 12104 as infrared cameras, and a procedure of performing pattern matching processing on a series of characteristic points indicating the outline of the object to determine whether or not it is a pedestrian. When the microcomputer 12051 determines that a pedestrian exists in the image captured by the imaging units 12101 to 12104 and the pedestrian is recognized, the audio image output unit 12052 controls the display 12062 such that a square outline for emphasizing the recognized pedestrian is displayed in a superimposed manner. Furthermore, the audio image output unit 12052 may control the display 12062 such that an icon or the like indicating the pedestrian is displayed at a desired position.

An exemplary vehicle control system to which the technology according the present disclosure can be applied has been described above. The technology according to the present disclosure can be applied to the imaging unit 12031 in the configuration described above. Specifically, a configuration including the multilayer film filter 11 in FIG. 1 may be adopted to the imaging unit 12031. As a result, the imaging unit 12031 can, for example, suppress the occurrence of the transmission wavelength shift and capture a high quality image without unevenness in image quality, whereby an image easily viewed by the driver can be provided.

Note that the present technology can also employ the following configurations.

(1)

A solid-state image pickup device including at least a first layer having a first refractive index, a second layer having a second refractive index, and a third layer having a third refractive index, which are laminated, the solid-state image pickup device including:

a multilayer film filter having a laminated structure in which the second layer is sandwiched between the first layer and the third layer, in which the second layer is formed such that at least two types of dielectrics having different refractive indexes mixedly exist and an effective refractive index is determined according to a ratio of the mixture, and the ratio of the mixture of the two types of dielectrics is adjusted across a surface of the second layer such that the effective refractive index of the second layer gradually increases from a portion in which an incident angle of light emitted onto the multilayer film filter is small toward a portion in which the incident angle of light is large.

(2)

The solid-state image pickup device according to (1) above, in which in a first dielectric serving as a base material having a predetermined refractive index, a second dielectric having a refractive index different from the refractive index of the first dielectric is embedded in the second layer so that the second layer includes a structure, which is formed by the second dielectric, having a size smaller than a transmission wavelength of light transmitted through the multilayer film filter.

(3)

The solid-state image pickup device according to (2) above, in which
a ratio of the second dielectric to the first dielectric is adjusted by changing a dimension of the structure according to the incident angle of light.

(4)

The solid-state image pickup device according (3) above, in which
in a case where the refractive index of the first dielectric is smaller than the refractive index of the second dielectric, the ratio of the second dielectric to the first dielectric is adjusted by enlarging the dimension of the structure in a region in which the incident angle of light becomes large.

(5)

The solid-state image pickup device according to (2) above, in which
a ratio of the second dielectric to the first dielectric is adjusted by changing an arrangement density of the structure according to the incident angle of light.

(6)

The solid-state image pickup device according to (5) above, in which
in a case where the refractive index of the first dielectric is smaller than the refractive index of the second dielectric, the ratio of the second dielectric to the first dielectric is adjusted by increasing the arrangement density of the structure in a region in which the incident angle of light becomes large.

(7)

The solid-state image pickup device according to any one of (1) to (6) above, in which
in the multilayer film filter, the effective refractive index of the second layer is set for each of a plurality of regions such that light in a different wavelength band is transmitted in each region, and
in each of the regions, the ratio of the mixture of the two types of dielectrics is adjusted according to the incident angle of light.

(8)

The solid-state image pickup device according to any one of (1) to (7) above, in which
the solid-state image pickup device has a structure in which the multilayer film filter, a photoelectric conversion layer in which a photoelectric conversion portion is formed for each pixel, and a readout circuit that reads a pixel signal from the photoelectric conversion layer are laminated in that order from a light incident surface side.

(9)

The solid-state image pickup device according to any one of (1) to (8) above, in which the second refractive index is smaller than the first refractive index and the third refractive index.

(10)

The solid-state image pickup device according to any one of (1) to (9) above, in which
the first layer and the third layer are multilayer film layers in which a film including a material having a different refractive index is laminated.

(11)

The solid-state image pickup device according to any one of (1) to (10) above, in which
the first refractive index and the third refractive index are substantially the same.

(12)

A method of manufacturing a solid-state image pickup device including at least a first layer having a first refractive index, a second layer having a second refractive index, and a third layer having a third refractive index, which are laminated, the solid-state image pickup device including:
a multilayer film filter having a laminated structure in which the second layer is sandwiched between the first layer and the third layer, in which
the second layer is formed such that at least two types of dielectrics having different refractive indexes mixedly exist and an effective refractive index is determined according to a ratio of the mixture,
the ratio of the mixture of the two types of dielectrics is adjusted across a surface of the second layer such that the effective refractive index of the second layer gradually increases from a portion in which an incident angle of light emitted onto the multilayer film filter is small toward a portion in which the incident angle of light is large, and
the method includes steps of:
embedding, in a first dielectric serving as a base material having a predetermined refractive index, a second dielectric having a refractive index different from the refractive index of the first dielectric; and
forming, using the second dielectric, a structure having a size smaller than a transmission wavelength of light transmitted through the multilayer film filter.

(13)

An electronic device, including:
a solid-state image pickup device including at least a first layer having a first refractive index, a second layer having a second refractive index, and a third layer having a third refractive index, which are laminated, the solid-state image pickup device including:
a multilayer film filter having a laminated structure in which the second layer is sandwiched between the first layer and the third layer, in which
the second layer is formed such that at least two types of dielectrics having different refractive indexes mixedly exist and an effective refractive index is determined according to a ratio of the mixture, and
the ratio of the mixture of the two types of dielectrics is adjusted across a surface of the second layer such that the effective refractive index of the second layer gradually increases from a portion in which an incident angle of light emitted onto the multilayer film filter is small toward a portion in which the incident angle of light is large.

Note that the present embodiment is not limited to the embodiments described above, and various modifications are possible without departing from the gist of the present disclosure.

REFERENCE SIGNS LIST

11 Multilayer film filter
21 First multilayer film layer
22 Transmission wavelength adjustment layer
23 Second multilayer film layer
31, 32 High refractive index material
33 Low refractive index material
41 Resist
42 Hole
51 Image pickup device
52 Photoelectric conversion layer
53 Readout circuit 54 Semiconductor circuit
55 Photoelectric conversion film

The invention claimed is:
1. A solid-state image pickup device, comprising:
a multilayer film filter having a laminated structure, wherein the laminated structure comprises:
a first layer having a first refractive index;
a second layer having a second refractive index; and
a third layer having a third refractive index, wherein
the third layer is sandwiched between the first layer and the second layer,
the third layer includes a mixture of at least two types of dielectrics having different refractive indexes,
an effective refractive index of the third layer is determined based on a ratio of the mixture of the at least two types of dielectrics, and
the ratio of the mixture of the at least two types of dielectrics is adjusted across a surface of the third layer such that the effective refractive index of the third layer gradually increases from a first portion of an imaging surface of the solid-state image pickup device toward a second portion of the imaging surface of the solid-state image pickup device, wherein
in the first portion an incident angle of light emitted onto the multilayer film filter is small, and
in the second portion the incident angle of light is large.

2. The solid-state image pickup device according to claim 1, wherein
the third layer includes a second dielectric embedded in a first dielectric serving as a base material,
the first dielectric has a fourth refractive index,
the second dielectric has a fifth refractive index different from the fourth refractive index of the first dielectric, and
the third layer includes a structure, which is formed by the second dielectric, having a size smaller than a transmission wavelength of light transmitted through the multilayer film filter.

3. The solid-state image pickup device according to claim 2, wherein
a ratio of the second dielectric to the first dielectric is adjusted based on a change in a dimension of the structure, and
the dimension of the structure is changed based on the incident angle of light.

4. The solid-state image pickup device according to claim 3, wherein based on the fourth refractive index of the first dielectric that is smaller than the fifth refractive index of the second dielectric, the ratio of the second dielectric to the first dielectric is adjusted based on an enlargement of the dimension of the structure in a region in which the incident angle of light becomes large.

5. The solid-state image pickup device according to claim 2, wherein
a ratio of the second dielectric to the first dielectric is adjusted based on a change in an arrangement density of the structure, and
the arrangement density of the structure is changed based on the incident angle of light.

6. The solid-state image pickup device according to claim 5, wherein based on the fourth refractive index of the first dielectric that is smaller than the fifth refractive index of the second dielectric, the ratio of the second dielectric to the first dielectric is adjusted based on an increase of the arrangement density of the structure in a region in which the incident angle of light becomes large.

7. The solid-state image pickup device according to claim 1, wherein
in the multilayer film filter, the effective refractive index of the third layer is set for each of a plurality of regions such that light in a different wavelength band is transmitted in each region of the plurality of regions, and
in each of the plurality of regions, the ratio of the mixture of the at least two types of dielectrics is adjusted based on the incident angle of light.

8. The solid-state image pickup device according to claim 1, wherein
the solid-state image pickup device has a structure in which the multilayer film filter, a photoelectric conversion layer having a photoelectric conversion portion for each pixel, and a readout circuit configured to read a pixel signal from the photoelectric conversion layer are laminated in that order from a light incident surface side.

9. The solid-state image pickup device according to claim 1, wherein the third refractive index is smaller than the first refractive index and the second refractive index.

10. The solid-state image pickup device according to claim 1, wherein the first layer and the second layer are multilayer film layers in which a film including materials having a different refractive indexes is laminated.

11. The solid-state image pickup device according to claim 1, wherein the first refractive index and the second refractive index are substantially same.

12. A method of manufacturing a solid-state image pickup device, comprising:
embedding, in a first dielectric serving as a base material, a second dielectric, wherein
the first dielectric has a first refractive index different from a second refractive index of the second dielectric; and
forming, using the second dielectric, a structure having a size smaller than a transmission wavelength of light transmitted through a multilayer film filter of the solid-state image pickup device, wherein
the multilayer film filter has a laminated structure comprising:
a first layer having a third refractive index;
a second layer having a fourth refractive index; and
a third layer having a fifth refractive index, wherein
the third layer is sandwiched between the first layer and the second layer,
the third layer includes a mixture of at least two types of dielectrics having different refractive indexes,
an effective refractive index of the third layer is determined based on a ratio of the mixture of the at least two types of dielectrics, and
the ratio of the mixture of the at least two types of dielectrics is adjusted across a surface of the third layer such that the effective refractive index of the third layer gradually increases from a first portion of an imaging surface of the solid-state image pickup device toward a second portion of the imaging surface of the solid-state image pickup device, wherein
in the first portion an incident angle of light emitted onto the multilayer film filter is small, and
in the second portion the incident angle of light is large.

13. An electronic device, comprising:
a solid-state image pickup device including:
a multilayer film filter having a laminated structure, wherein the laminated structure comprises:
a first layer having a first refractive index;
a second layer having a second refractive index; and a third layer having a third refractive index, wherein the third layer is sandwiched between the first layer and the second layer, the third layer includes a mixture of at least two types of dielectrics having different refractive indexes, an effective refractive index of the third layer is determined based on a ratio of the mixture of the at least two types of dielectrics, and the ratio of the mixture of the at least two types of dielectrics is adjusted across a surface of the third layer such that the effective refractive index of the third layer gradually increases from a first portion of an imaging surface of the solid-state image pickup device toward a second portion of the imaging surface of the solid-state image pickup device, wherein in the first portion an incident angle of light emitted onto the multilayer film filter is small, and in the second portion the incident angle of light is large;

an optical system configured to guide incident light from an object to the solid-state image pickup device; and a signal processing circuit configured to process a pixel signal output from the solid-state image pickup device.

\* \* \* \* \*